(12) United States Patent
Shappir et al.

(10) Patent No.: US 11,550,657 B1
(45) Date of Patent: Jan. 10, 2023

(54) EFFICIENT PROGRAMMING SCHEMES IN A NONVOLATILE MEMORY

(71) Applicant: APPLE INC., Cupertino, CA (US)

(72) Inventors: Assaf Shappir, Ganey Tikva (IL); Itay Sagron, Gedera (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/463,612

(22) Filed: Sep. 1, 2021

(51) Int. Cl.
*G06F 11/10* (2006.01)
*G11C 7/10* (2006.01)
*G11C 11/56* (2006.01)

(52) U.S. Cl.
CPC ........ *G06F 11/1068* (2013.01); *G11C 7/1069* (2013.01); *G11C 7/1096* (2013.01); *G11C 11/56* (2013.01); *G11C 2211/5623* (2013.01)

(58) Field of Classification Search
CPC ... G06F 11/1068; G11C 11/56; G11C 7/1096; G11C 7/1069; G11C 2211/5623
See application file for complete search history.

(56) References Cited

U.S. PATENT DOCUMENTS

| | | |
|---|---|---|
| 4,841,482 A | 6/1989 | Kreifels |
| 5,181,025 A | 1/1993 | Ferguson et al. |
| 5,331,594 A | 7/1994 | Hotta |
| 5,372,712 A | 12/1994 | Petit |
| 5,428,621 A | 6/1995 | Mehrotra et al. |
| 5,440,516 A | 8/1995 | Slemmer |
| 5,581,509 A | 12/1996 | Golla et al. |
| 5,602,778 A | 2/1997 | Futatsuya et al. |
| 5,606,527 A | 2/1997 | Kwack et al. |
| 5,684,747 A | 11/1997 | Urai |
| 5,748,545 A | 5/1998 | Lee et al. |
| 5,796,653 A | 8/1998 | Gaultier |
| 5,847,995 A | 12/1998 | Kobayashi et al. |
| 5,898,637 A | 4/1999 | Lakhani et al. |
| 6,031,772 A | 2/2000 | Nagatomo |
| 6,545,910 B2 | 4/2003 | Byeon et al. |
| 6,650,585 B2 | 11/2003 | Chevallier |
| 6,707,078 B1 | 3/2004 | Shiraiwa et al. |
| 6,813,183 B2 | 11/2004 | Chevallier |
| 7,089,460 B2 | 8/2006 | Fu |
| 7,212,454 B2 | 5/2007 | Kleveland et al. |
| 7,319,623 B1 | 1/2008 | Yuan et al. |
| 7,440,347 B1 | 10/2008 | Vogelsang |

(Continued)

*Primary Examiner* — Guy J Lamarre
(74) *Attorney, Agent, or Firm* — Kligler & Associates Patent Attorneys Ltd

(57) ABSTRACT

A storage apparatus includes an interface and storage circuitry. The interface communicates with a plurality of memory cells, and an individual one of the plurality of memory cells stores data in multiple programming levels. The storage circuitry configured to program data to a first group of multiple memory cells in a number of programming levels larger than two, using a One-Pass Programming (OPP) scheme that results in a first readout reliability level. After programming the data, the storage circuitry is further configured to read the data from the first group, and program the data read from the first group to a second group of the memory cells, in a number of programming levels larger than two, using a Multi-Pass Programming (MPP) scheme that results in a second readout reliability higher than the first reliability level, and reading the data from the second group of the memory cells.

24 Claims, 5 Drawing Sheets

(56) References Cited

U.S. PATENT DOCUMENTS

| | | |
|---|---|---|
| 7,463,529 B2 | 12/2008 | Matsubara |
| 7,856,528 B1 | 12/2010 | Frost et al. |
| 7,873,803 B2 | 1/2011 | Cheng |
| 8,176,284 B2 | 5/2012 | Frost et al. |
| 8,305,807 B2 | 11/2012 | Shah et al. |
| 8,379,454 B2 | 2/2013 | Kochar et al. |
| 8,432,732 B2 | 4/2013 | Li et al. |
| 8,473,780 B2 | 6/2013 | Shalvi |
| 8,478,796 B2 | 7/2013 | Post et al. |
| 8,514,630 B2 | 8/2013 | Huynh et al. |
| 8,566,671 B1 | 10/2013 | Ye et al. |
| 8,645,749 B2 | 2/2014 | Reche |
| 8,645,776 B2 | 2/2014 | Byom et al. |
| 8,730,722 B2 | 5/2014 | Koh et al. |
| 8,732,557 B2 | 5/2014 | Ratnam et al. |
| 8,767,459 B1 | 7/2014 | Kasorla et al. |
| 8,775,901 B2 | 7/2014 | Sharon et al. |
| 8,832,357 B2 | 9/2014 | Yao et al. |
| 8,892,981 B2 | 11/2014 | Post et al. |
| 8,902,657 B2 | 12/2014 | Iwai et al. |
| 8,977,813 B2 | 3/2015 | Burd |
| 9,021,339 B2 | 4/2015 | Lu et al. |
| 9,021,343 B1 | 4/2015 | Hu et al. |
| 9,032,272 B2 | 5/2015 | Yoon et al. |
| 9,053,809 B2 | 6/2015 | Anholt et al. |
| 9,058,261 B1 | 6/2015 | Jean et al. |
| 9,092,363 B2 | 7/2015 | Avila et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,177,610 B2 | 11/2015 | D'Abreu et al. |
| 9,330,783 B1 | 5/2016 | Rotbard et al. |
| 9,355,713 B2 | 5/2016 | Huang et al. |
| 9,390,809 B1 | 7/2016 | Shur et al. |
| 9,406,346 B2 | 8/2016 | D'Abreu et al. |
| 9,454,429 B2 | 9/2016 | Ojalvo et al. |
| 9,489,263 B2 | 11/2016 | Hyun et al. |
| 9,529,663 B1 | 12/2016 | Srinvasan et al. |
| 9,542,312 B2 | 1/2017 | Yang et al. |
| 9,569,143 B1 * | 2/2017 | Sehgal ............... G11C 16/0483 |
| 9,619,321 B1 | 4/2017 | Haratsch et al. |
| 9,685,233 B2 | 6/2017 | Hsieh et al. |
| 9,811,413 B2 | 11/2017 | Ojalvo et al. |
| 9,847,141 B1 | 12/2017 | Sagiv et al. |
| 9,870,169 B2 | 1/2018 | Ramalingam et al. |
| 9,928,126 B1 * | 3/2018 | Shappir ............... G06F 11/108 |
| 9,959,168 B2 | 5/2018 | Achtenberg et al. |
| 9,984,771 B2 | 5/2018 | Bonke |
| 9,996,417 B2 | 6/2018 | Shappir et al. |
| 10,008,250 B2 | 6/2018 | Ramalingam |
| 10,055,294 B2 | 8/2018 | Hyun et al. |
| 10,090,044 B2 | 10/2018 | Achtenberg et al. |
| 10,109,361 B1 | 10/2018 | Khakifirooz et al. |
| 10,191,683 B2 | 1/2019 | Srinivasan et al. |
| 10,474,530 B2 | 11/2019 | Yeh |
| 10,740,476 B2 | 8/2020 | Shappir et al. |
| 10,755,787 B2 | 8/2020 | Yazovitsky et al. |
| 10,762,967 B2 | 9/2020 | Shappir et al. |
| 10,915,394 B1 | 2/2021 | Shappir et al. |
| 10,936,455 B2 | 3/2021 | Yazovitsky et al. |
| 2002/0174295 A1 | 11/2002 | Ulrich et al. |
| 2008/0052446 A1 | 2/2008 | Lasser et al. |
| 2009/0157964 A1 | 6/2009 | Kasorla et al. |
| 2009/0225607 A1 | 9/2009 | Chen et al. |
| 2010/0128525 A1 | 5/2010 | Mokhlesi |
| 2010/0329052 A1 | 12/2010 | Chen et al. |
| 2011/0066793 A1 | 3/2011 | Burd |
| 2011/0149651 A1 * | 6/2011 | Gorobets ............ G11C 16/0483<br>365/185.11 |
| 2011/0209028 A1 | 8/2011 | Post et al. |
| 2012/0148255 A1 | 6/2012 | Liu et al. |
| 2012/0159281 A1 | 6/2012 | Shalvi et al. |
| 2012/0311244 A1 * | 12/2012 | Huang ................. G11C 11/5628<br>711/E12.008 |
| 2012/0320671 A1 * | 12/2012 | Meir ................... G11C 13/0061<br>365/185.03 |
| 2013/0024748 A1 | 1/2013 | Sharon et al. |
| 2013/0031429 A1 | 1/2013 | Sharon et al. |
| 2013/0117606 A1 | 5/2013 | Anholt et al. |
| 2013/0229868 A1 | 9/2013 | Koh et al. |
| 2013/0268724 A1 | 10/2013 | Seo et al. |
| 2013/0294168 A1 | 11/2013 | Shirakawa |
| 2014/0047291 A1 | 2/2014 | Shalvi et al. |
| 2014/0095259 A1 | 3/2014 | Tam et al. |
| 2014/0157078 A1 | 6/2014 | Danilak et al. |
| 2014/0189421 A1 | 7/2014 | Werner et al. |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |
| 2015/0154069 A1 | 6/2015 | Tuers et al. |
| 2015/0178150 A1 | 6/2015 | Silberman et al. |
| 2016/0034353 A1 | 2/2016 | Tuers et al. |
| 2016/0098216 A1 | 4/2016 | Huang et al. |
| 2017/0177265 A1 * | 6/2017 | Srinivasan ............ G06F 3/0638 |
| 2018/0032276 A1 * | 2/2018 | Srinivasan ............ G06F 3/0679 |
| 2018/0203774 A1 | 7/2018 | Srinivasan et al. |
| 2018/0349044 A1 * | 12/2018 | Baum .................. G06F 11/108 |
| 2019/0095116 A1 | 3/2019 | Igahara et al. |
| 2019/0163620 A1 * | 5/2019 | Muthiah ............... G06F 9/3013 |
| 2019/0198113 A1 | 6/2019 | Ben-Rubi et al. |
| 2019/0317672 A1 | 10/2019 | Linnen et al. |

* cited by examiner

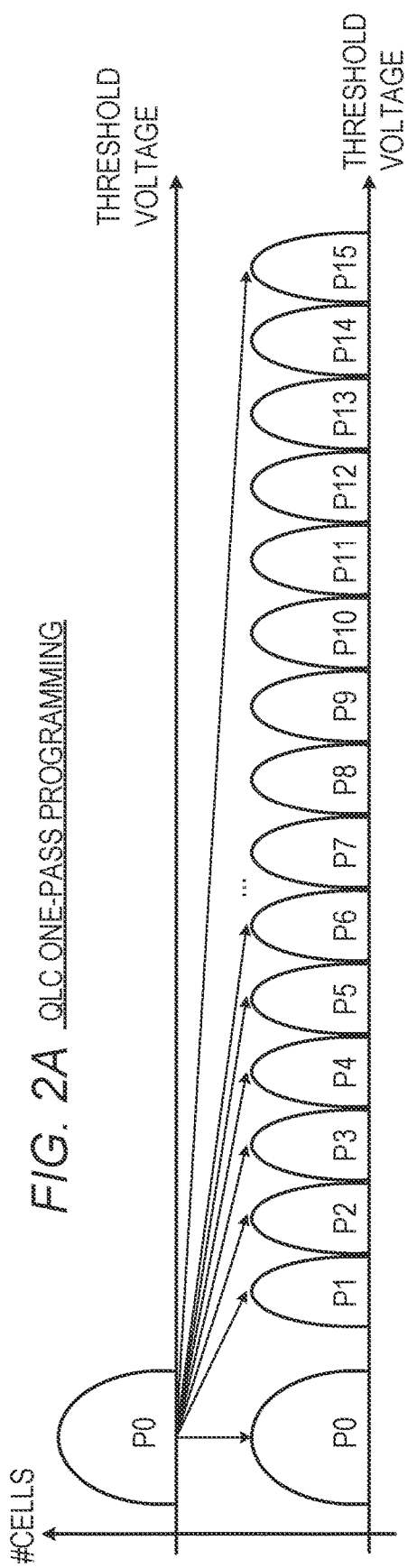
FIG. 2A  QLC ONE-PASS PROGRAMMING
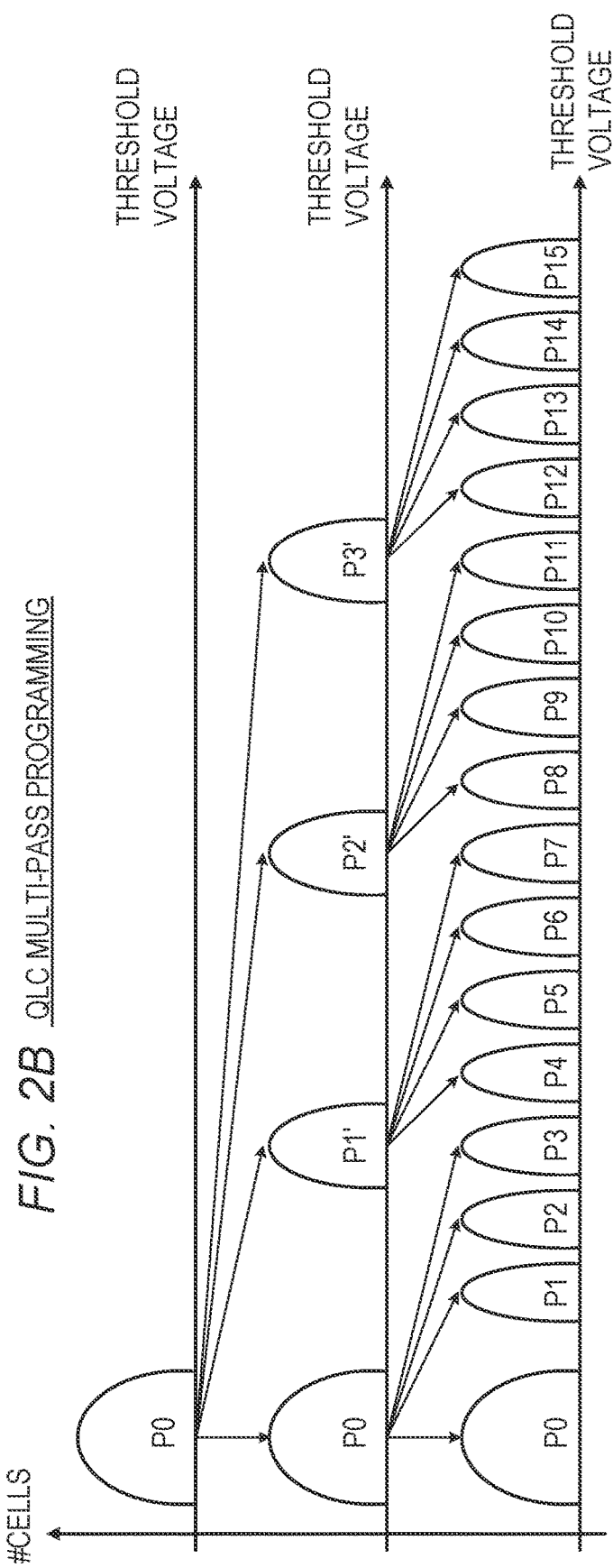
FIG. 2B  QLC MULTI-PASS PROGRAMMING

PROGRAM FAST USING OPP AND LATER COPY TO FINAL STORAGE USING MPP

SLC FULL - STORE IN QLC USING OPP AND LATER COPY TO FINAL STORAGE USING MPP

FAST EVICTION FROM SLC STORAGE

1

EFFICIENT PROGRAMMING SCHEMES IN A NONVOLATILE MEMORY

TECHNICAL FIELD

Embodiments described herein relate generally to data storage, and particularly to methods and systems for efficient programming of a nonvolatile memory.

BACKGROUND

Various types of nonvolatile memories include multiple memory cells, each of which is programmed to assume a nominal programming level, selected from multiple predefined programming levels. Methods for programming nonvolatile memories are known in the art. For example, U.S. Pat. No. 10,109,361 describes a memory programmer apparatus that may include a first-level programmer to program a first-level cell portion of a multi-level memory in a first pass, a coarse programmer to coarse program a second-level cell portion of the multi-level memory in the first pass, wherein the second-level cell portion includes more levels than the first-level cell portion, and a fine programmer to fine program the second-level cell portion of the multi-level memory in a second pass from data programmed in the first-level cell portion in the first pass.

SUMMARY

An embodiment that is described herein provides a storage apparatus that includes an interface and storage circuitry. The interface is configured to communicate with a plurality of memory cells, and an individual one of the plurality of memory cells is configured to store data in multiple programming levels. The storage circuitry is configured to program data to a first group of multiple memory cells in a number of programming levels larger than two, using a One-Pass Programming (OPP) scheme that results in a first readout reliability level. After programming the data, the storage circuitry is further configured to read the data from the first group, and program the data read from the first group to a second group of the memory cells, in a number of programming levels larger than two, using a Multi-Pass Programming (MPP) scheme that results in a second readout reliability higher than the first reliability level, and to read the data from the second group of the memory cells.

In some embodiments, a number of programming levels in using the OPP scheme equals a number of programming levels in using the MPP scheme. In other embodiments, a number of programming levels in using the OPP scheme differs from a number of programming levels in using the MPP scheme. In yet other embodiments, the data stored in the first group using the OPP scheme is encoded using a first Error Correction Code (ECC), and the storage circuitry is configured to decode the first ECC of the encoded data read from the first group to produce decoded data, to re-encode the decoded data using a second ECC for producing re-encoded data, and to program the re-encoded data in the second group using the MPP scheme. In yet further other embodiments, the first ECC has higher decoding capabilities compared to the second ECC.

In an embodiment, the storage circuitry is configured, in response to detecting that programming the data in the first group has failed, to apply a first data recovery scheme, and in response to detecting that programming the data in the second group has failed, to apply a second data recovery scheme. In another embodiment, the first data recovery scheme supports recovering an amount of data larger than the second data recovery scheme. In yet another embodiment, the storage circuitry is configured to program the data to the second group using the MPP scheme in selected periods during which the storage circuitry has available resources for programming the data to the second group using the MPP scheme.

In some embodiments, the storage circuitry is configured to initially program second data in a Single-Level Cell (SLC) mode, outside the first group and the second group. In other embodiments, the storage circuitry is configured to read at least part of the second data that was programmed in SLC mode, and to program the at least part of the second data in the first group using the OPP scheme, for freeing up SLC storage space. In yet other embodiments, the storage circuitry is configured to assign storage space for storage in a Single-Level Cell (SLC) mode, but to store the data in the first group using the OPP scheme, in response to identifying that no free space is available in the storage space assigned for programming in the SLC mode.

In an embodiment, the storage circuitry is configured to assign storage space for storage in a Single-Level Cell (SLC) mode, to program third data to the assigned storage space in SLC mode and at a later time copy the data from the assigned storage space to another storage space using the MPP scheme or using the OPP scheme, to monitor a rate of receiving the third data for programming, and to program the third data using the MPP scheme or using the OPP scheme without first programming the third data to the assigned storage space, in response to identifying that a rate of receiving the third data is below a predefined threshold rate.

There is additionally provided, in accordance with an embodiment that is described herein, a method for data storage, including, in a storage apparatus that communicates with a plurality of memory cells, and an individual one of the plurality of memory cells stores data in multiple programming levels, programming data to a first group of multiple memory cells, in a number of programming levels larger than two, using a One-Pass Programming (OPP) scheme that results in a first readout reliability level. After programming the data, the data is read from the first group, and the data read from the first group is programmed to a second group of the memory cells, in a number of programming levels larger than two, using a Multi-Pass Programming (MPP) scheme that results in a second readout reliability higher than the first reliability level. The data is read from the second group of the memory cells.

These and other embodiments will be more fully understood from the following detailed description of the embodiments thereof, taken together with the drawings in which:

BRIEF DESCRIPTION OF THE DRAWINGS

FIGS. 2A and 2B are diagrams that schematically illustrate voltage distributions in one-pass and multi-pass programming schemes, in accordance with embodiments that are described herein;

DETAILED DESCRIPTION OF EMBODIMENTS

Overview

Figure 1:
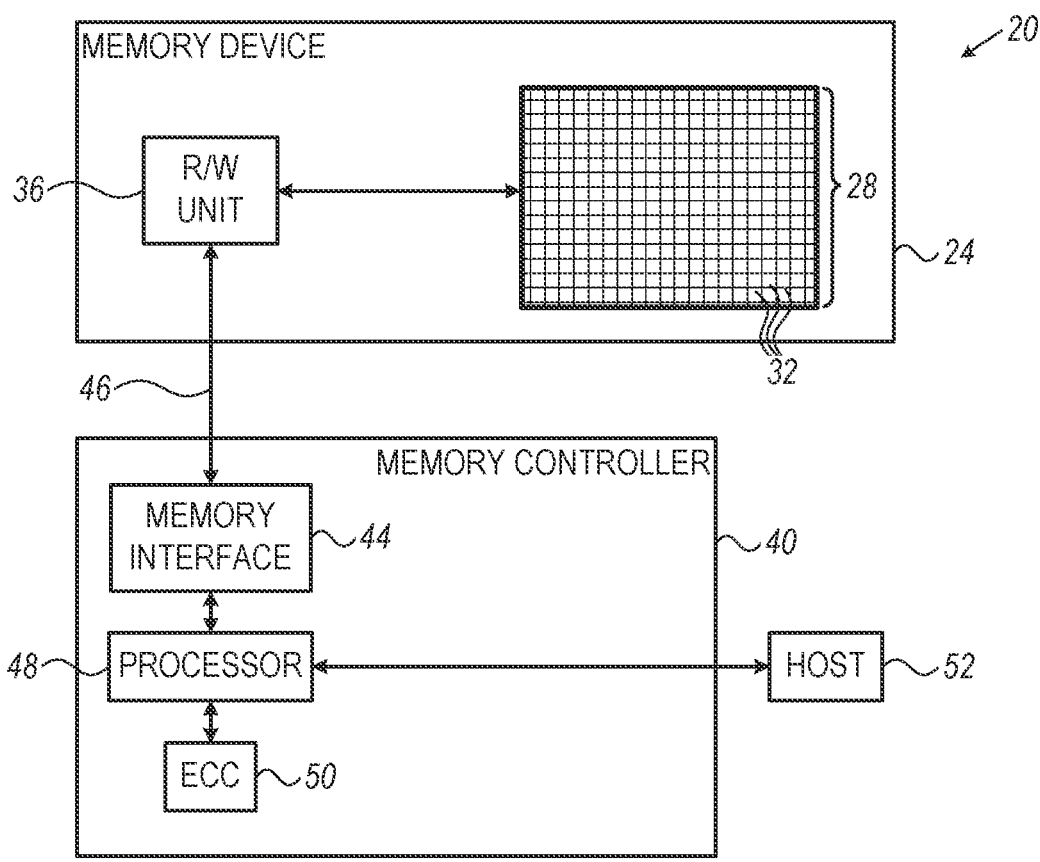
FIG. 1 is a block diagram that schematically illustrates a memory system, in accordance with an embodiment that is described herein.

Embodiments that are described herein provide improved methods and systems for efficient programming of a nonvolatile memory.

Various types of nonvolatile memory devices include memory cells that are programmed to assume respective programming levels selected from among multiple predefined nominal programming levels. To program a memory cell to a certain programming level, a sequence of programming pulses is applied to the memory cells, so as to gradually increase their threshold voltages toward the desired levels. In practice, multiple memory cells that belong to a common Word Line (WL) are typically programmed concurrently.

Since different memory cells may react differently to the programming pulses, the threshold voltages of memory cells programmed to common respective programming levels are typically distributed about the nominal programming levels in accordance with respective voltage distributions. The mean values and widths (or variances) of the voltage distributions typically depend on the underlying programming scheme used.

When voltage distributions corresponding to adjacent nominal programming levels overlap, a memory cell that was programmed to one of the nominal programming levels may be erroneously sensed as programmed to the other programing level. Storage reliability thus degrades with increasing the range of overlap. A programming scheme that results in wide voltage distributions may result in poor storage reliability compared to alternative programming schemes that result in narrower voltage distributions.

The storage industry constantly pushes toward low-cost high-density storage devices. One approach to achieve high density is to store a high number of bits per cell, which also increases the number of nominal programming levels required. For example, Quad-Level Cell (QLC) and Penta-Level Cell (PLC) devices store 4 bits and 5 bits per cell, respectively, resulting in respective numbers of 16 and 32 programming levels. A disadvantage of increasing the number of programming levels, however, is increased probability of overlapping between adjacent voltage distributions, and therefore decreased storage reliability.

Another demand from storage systems is to allow the user to program large amounts of data continuously with little interruptions or delays as possible. Fast and continuous writing for the user may be achieved by first storing the user data in a SLC mode using 1 bit per cell. At a later time, the data stored in SLC mode is read back and re-programmed in another storage area, e.g., in QLC mode. This solution may be satisfactory for small amounts of data, but since SLC storage space is typically limited, receiving user data may need to be repeatedly stopped until sufficient SLC storage space becomes available.

In principle, the data stored in SLC mode could be copied for storage in a higher programming mode such as QLC using One-Pass Programming (OPP) or using Multi-Pass Programming (MPP). In OPP, erased memory cells are programmed directly to their final storage voltages. In MPP, the erased memory cells are programmed to their final storage levels in one or more intermediate programming iterations.

In each intermediate iteration the memory cells are programmed in a number of intermediate storage values smaller than the number of final programming levels. Alternatively, the memory cells may be programmed in an intermediate iteration to the final number of programming levels and are further programed in a subsequent pass to narrow the voltage distributions. In the last iteration, the memory cells are pushed from the last intermediate storage values to the final programming levels.

In a two-pass MPP, the next WL is typically programmed to the intermediate levels before completing programming the current WL to the final programming levels, so as to reduce disturbances. This scheme may be extended to MPP that runs more than two passes.

Programming using OPP is faster than using MPP but is typically less reliable, e.g., because of larger disturbances from next to be programmed memory cells in other WLs. Readout reliability may be measured by the average number of errors in data units retrieved from memory. As the number of errors increases, the reliability level decreases. In practical storage systems, because of the degraded reliability in OPP, data stored in SLC may be copied in QLC mode using MPP. This approach may, however, result in long programming delays when memory blocks that are assigned for storage in SLC mode become sparse, due to high writing rate by the user.

In the disclosed embodiments, a novel programming scheme is employed, in which data is first programmed quickly in QLC mode using OPP in one storage area, and is later copied to another storage area in QLC mode using MPP. The programming scheme is not limited to QLC mode and is similarly applicable in other programming modes such as TLC and PLC.

Consider an embodiment of a storage apparatus that includes an interface and storage circuitry. The interface is configured to communicate with a plurality of memory cells, wherein an individual one of the plurality of memory cells is configured to store data in multiple programming levels. The storage circuitry is configured to program data to a first group of multiple memory cells, in a number of programming levels larger than two, using a One-Pass Programming (OPP) scheme that results in a first readout reliability level. After programming the data, the storage circuitry is configured to read the data from the first group and program the data read from the first group to a second group of the memory cells, in a number of programming levels larger than two, using a Multi-Pass Programming (MPP) scheme that results in a second readout reliability higher than the first reliability level, and to read the data from the second group of the memory cells.

In an embodiment, the number of programming levels in using the OPP scheme equals the number of programming levels in using the MPP scheme. In another embodiment, the number of programming levels in using the OPP scheme differs from the number of programming levels in using the MPP scheme.

In some embodiments, the data stored in the first group using the OPP scheme is encoded using a first Error Correction Code (ECC), and the storage circuitry is configured to decode the first ECC of the encoded data read from the first group to produce decoded data, to re-encode the decoded data using a second ECC for producing re-encoded data, and to program the re-encoded data in the second group using the MPP scheme. In some embodiments, because data storage using OPP is less reliable than using MPP the first ECC has higher decoding capabilities compared to the second ECC.

In an embodiment, following programming, the storage circuitry applies recovery schemes in programming using the OPP and MPP schemes. In such an embodiment, in response to detecting that programming the data in the first group has failed, the storage circuitry applies a first data recovery scheme, and in response to detecting that programming the data in the second group has failed, the storage circuitry applies a second data recovery scheme. Since OPP is less reliable than MPP, the storage circuitry may apply the data recovery schemes so that the first data recovery scheme has higher recovery capabilities than the second data recovery scheme.

The storage circuitry may also perform a read verify operation to the data programmed using MPP, before marking for erasure a relevant memory block that was programmed using OPP. Typically, however, no read verify operation is performed to data programmed using OPP because this would slow down the device.

The storage circuitry may select suitable times for copying the data from the first group to the second group using the MPP scheme, e.g., at idle times, and/or at selected periods during which the storage circuitry has available resources for programming the data to the second group using the MPP scheme.

In some embodiments the data to be stored in the second group is initially programmed in a Single-Level Cell (SLC) mode to a dedicated SLC storage space. In such embodiments, reading the data from the SLC storage space is carried out for freeing up at least some of the SLC storage space.

In some embodiments, the storage circuitry is configured to initially program second data in a Single-Level Cell (SLC) mode, outside the first group and the second group. For fast eviction from SLC storage space, the storage circuitry reads at least part of the second data that was programmed in SLC mode, and programs the at least part of the second data in the first group using the OPP scheme, for freeing up SLC storage space.

In an embodiment, the storage circuitry assigns a storage space for storage in a SLC mode, but stores the data in the first group using the OPP scheme, in response to identifying that no free space is available in the storage space assigned for programming in the SLC mode.

In another embodiment, the storage circuitry is configured to program third data to a storage space assigned to programming in SLC mode and at a later time copy the data from the assigned storage space to another storage space using the MPP scheme or using the OPP scheme. The storage circuitry further monitors the rate of receiving the third data for programming, and programs the third data using the MPP scheme or using the OPP scheme without first programming the third data to the assigned storage space, in response to identifying that a rate of receiving the third data is below a predefined threshold rate.

In some disclosed embodiments, the memory controller supports programming in SLC mode, QLC mode using OPP and QLC using MPP. The memory controller may switch between these programming schemes for achieving efficient programming under various requirements and varying conditions.

In the disclosed techniques, novel efficient programming schemes for fast and reliable storage in a nonvolatile memory are disclosed. Data is first programmed in multiple programming levels (e.g., in QLC mode) using OPP, which is fast but typically insufficiently reliable. Later, e.g., at idle times, the data is copied in multiple programming levels to another storage area, using MPP for final reliable storage. Programming schemes that involve initial programming in SLC mode are also disclosed.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 includes a memory device 24, which stores data in a memory array 28 that includes multiple memory cells 32, such as analog memory cells. In the context of the present patent application, the term "analog memory cell" is used to describe any memory cell that holds a continuous, analog value of a physical parameter, such as an electrical voltage or charge. Memory array 28 may include solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in memory cells 32 by programming the memory cells to assume respective memory states, which are also referred to as programming levels. The programming levels are selected from a finite set of predefined possible levels, and each programming level corresponds to a certain nominal storage value, also referred to as a nominal Programming Voltage (PV). For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), a 4 bit/cell MLCs, also respectively referred to as a Quad-Level Cell (QLC) and a 5 bit/cell MLC also referred to as a Penta-Level Cell (PLC) device, can be respectively programmed to assume one of eight, sixteen and thirty-two possible programming levels. A memory cell that stores a single bit (i.e., using two programming levels) is also referred to as a Single-Level Cell (SLC).

Memory device 24 includes a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. The R/W module can also read the storage values of the memory cells in selected ranges or zones by setting the read thresholds to zone boundaries.

The storage and retrieval of data in and out of memory device 24 is performed by a memory controller 40. Memory controller 40 includes a memory interface 44 for communicating with memory device 24, a processor 48, and an Error Correction Code (ECC) module 50. The memory controller communicates with the memory device via memory interface 44 over a communication link 46. Communication link 46 may include any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may include any suitable type of ECC, such as, for example, Low Density Parity Check (LDPC), Reed-Solomon (RS) or Bose-Chaudhuri-Hocquenghem (BCH), can be used. It should be noted, however, that embodiments that are described below that rely on calculating a syndrome weight refer mainly to codes that can be represented by a set of parity-check equations such as, for example, LDPC codes. Moreover, a good approximation of the number of errors from the syndrome weight is achieved for codes having a sparse parity-check matrix, such as, for example, LDPC codes.

Data read from a group of memory cells may contain one or more errors. The number of errors typically increases when the read threshold used for sensing the memory cells is positioned non-optimally. In some applications, the ECC supported by ECC module 50 can be represented by multiple parity-check equations.

Memory controller 40 may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a Redundant Array of Independent Disks (PAID) storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell includes a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subgroup of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may include thousands of erasure blocks (also referred to as "memory blocks"). In a typical two-dimensional (2D) two-bit-per-cell MLC device, each erasure block is on the order of 128 word lines, each including several tens of thousands of memory cells. Two-bit-per-cell devices having 128 word lines per erasure block that store a data page per bit significance value would have 256 data pages per erasure block, and three-bit-per-cell devices would have 394 data pages per block. A typical three-dimensional (3D) device that stores three bits per cell may include, for example, 4 sections per block, wherein each section includes several thousand strings that each includes 48 layers of cell columns. Such a 3D device has 12 data pages per a physical word line, or 576 data pages per an erasure block. Alternatively, other block sizes and configurations can also be used.

One-Pass and Multi-Pass Programming Schemes

FIGS. 2A and 2B are diagrams that schematically illustrate voltage distributions in one-pass and multi-pass programming schemes, in accordance with embodiments that are described herein.

In FIGS. 2A and 2B, memory cells 32 are programmed in a QLC mode using sixteen programming levels denoted P0 . . . P15. In the figures, the horizontal axis denotes threshold voltages, and the vertical axis denotes numbers of memory cells programmed to various threshold voltages.

In FIGS. 2A and 2B the memory cells are programmed by memory controller 40, R/W module 36 or both.

In FIG. 2A, the QLC memory cells are programmed using a One-Pass Programming (OPP) scheme. Initially, the memory cells are erased and belong to an erasure programming level denoted P0. In programming, the memory cells are subjected to programming pulses that gradually push their threshold voltages toward respective desired programming levels Pi, i=1 . . . 15. Typically, memory cells that reach their respective target voltages are excluded from receiving subsequent programming pulses.

In FIG. 2B, the QLC memory cells are programmed using a Multi-Pass Programming (MPP) scheme. In the present example, the MPP scheme includes a two-pass programming scheme. In the first pass, some of the erased memory cells at P0 that should be programmed to Pi, i>0, are programmed to intermediate programming levels denoted P1' . . . P3'. In the second pass, the memory cells at the intermediate levels are further pushed to their final programming levels among Pi, i=1 . . . 15. In the example of FIG. 2B, memory cells at a given intermediate level are programmed in the second pass to one of four final programming levels. In general, in using MPP, before performing the second pass to a given WL, the neighboring next WL will go through the first pass, so as to reduce disturbances or coupling effects between the WLs that would undesirably result in widening the voltage distributions.

The two-pass programming scheme in FIG. 2B is given by way of example, and other suitable MPP schemes may be used. For example, other suitable numbers of programming passes, and/or other numbers of intermediate levels in each pass can also be used. Although FIGS. 2A and 2B refer to programming in a QLC mode, other suitable MPP schemes may be used with other programming modes, e.g., in TLC mode or PLC mode.

In programming modes that use more than two programming levels, the OPP scheme is typically faster than the MPP scheme because the memory cells are programed to their final programming levels in one pass, rather than via two or more passes of intermediate programming levels. Programming using the MPP scheme is typically more accurate than using the OPP scheme because in OPP, programming to high programming levels may cause significant disturbances to neighbor memory cells that are already programmed, whereas in MPP the disturbances are lower because the neighbor memory cells are first programmed to the intermediate levels.

Since programming using OPP is less accurate than in using MPP, the voltage distributions in OPP typically tend to be wider than in MPP. Consequently, overlap between adjacent threshold voltages is more severe in OPP than in MPP, meaning that the number of errors in reading data that was programmed using OPP is typically higher than in MPP. In other words, reading data that was programmed using MPP is more reliable than in using OPP. In the example of FIGS. 2A and 2B, the voltage distributions in FIG. 2A are wider than in FIG. 2B, and therefore adjacent voltage distributions in FIG. 2A are more likely to overlap compared to FIG. 2B.

The OPP scheme has reduced readout reliability compared to the MPP scheme, also due to various factors other than programming accuracy. Such factors may include, for example, reduced data retention periods, reduced ability to read correctly when programming occurred at a different temperature, and the like.

It should be noted that factors such as those mentioned above generally reduce reliability in both OPP and MPP. The OPP scheme is however more sensitive than the MPP schemes, because OPP has smaller read margins than MPP, between neighbor distribution voltages. Data programmed using OPP may be copied to final storage using MPP during idle periods, in which case the temperature conditions are close to optimal and therefore programming using MPP does not suffer the full temperature swing and associated read margin loss.

Efficient Programming Schemes

In various storage systems, some of the storage space is allocated for programming in SLC mode, e.g., for fast and reliable storage. The storage space allocated for SLC is, however, typically limited because the amount of data that may be programmed to a given storage space using SLC is much smaller than programming that same storage space using more than two programming levels such as in one of the TLC, QLC and PLC modes. Consequently, in some embodiments, the data is typically stored initially in SLC mode and is later copied to non-SLC storage space, e.g., in TLC or QLC mode.

Figure 3A:
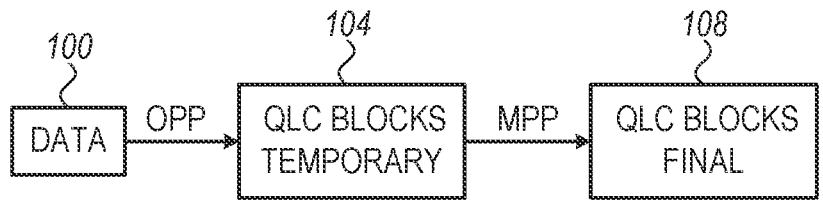
FIGS. 3A-3C are diagrams that schematically illustrate various efficient programing schemes, in accordance with embodiments that are described herein.
Figure 3B:
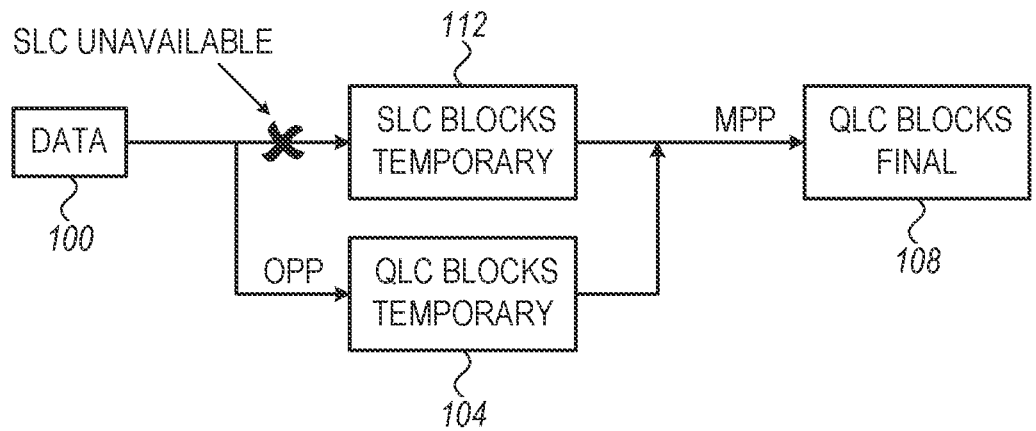
Figure 3C:
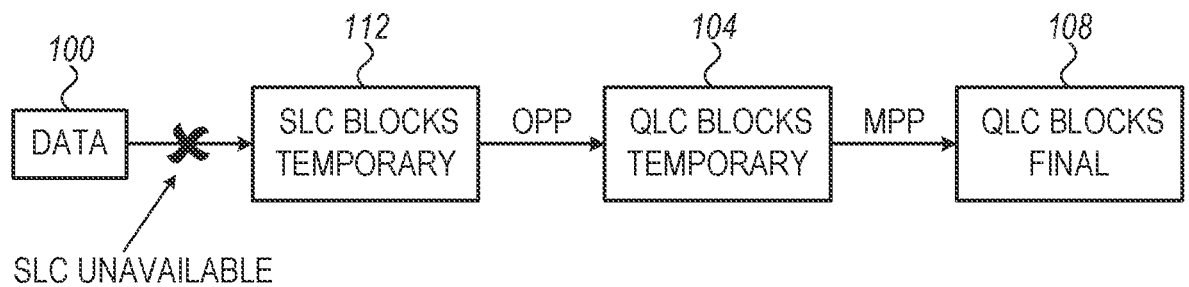

FIGS. 3A-3C are diagrams that schematically illustrate various efficient programing schemes, in accordance with embodiments that are described herein. In some embodiments, the programming schemes depicted in FIGS. 3A-3C may be implemented, for example, by memory controller 40, R/W module 36 or both. The programming schemes will be described as executed by memory controller 40.

In the programming scheme of FIG. 3A, memory controller 40 first programs data 100 to memory blocks 104 in QLC mode using OPP. This allows the memory controller to write large amounts of data in short periods of time (e.g., write a burst of data), which would not be possible using MPP, which is slower than OPP. Since programming using OPP in memory blocks 104 is considered insufficiently reliable, the memory controller later copies the data from memory blocks 104 to other memory blocks 108, by reading the data from memory blocks 104 and programming the read data to memory blocks 108 in QLC mode using MPP, for final reliable storage. Methods that describe in detail the copy operation and its scheduling will be described further below.

In the programming scheme of FIG. 3B, memory controller 40 first programs data 100 to memory blocks 112 in SLC mode, and at a later time copies the data from memory blocks 112 to memory blocks 108. To copy the data, the memory controller reads from memory blocks 112 data that was programmed in SLC mode, and programs the read data to memory blocks 108 in QLC mode using MPP.

In the example of FIG. 3B, the storage space allocated for storing data in SLC mode becomes full (or otherwise unavailable, e.g., to preserve SLC storage space). When the memory controller detects that the SLC storage space is unavailable, it bypasses the programming in SLC mode by applying a programming scheme similar to that of FIG. 3A. To this end, instead of programming data 100 to memory blocks 112 in SLC mode, the memory controller first programs the data to memory blocks 104 in QLC mode using OPP, and later reads the data from memory blocks 104 and programs the read data to memory blocks 108 in QLC mode using MPP. When at least some of memory blocks 112 become available again for SLC programming, the memory controller may revert to apply SLC programming followed by programming in QLC mode using MPP.

The decision to program using SLC or OPP before final programming using MPP may depend on various factors such as SLC storage space availability, rate in which data is flowing in, endurance counts of the memory blocks programed in SLC and QLC modes, device temperature (which also affects reliability), and the like.

In the programming scheme of FIG. 3C memory controller 40 identifies that no memory blocks 112 are available for programming in SLC mode. To free up at least some of the SLC storage space, the memory controller reads data from memory blocks 112 and programs the read data to memory blocks 104 in QLC mode using OPP. Later, the memory controller reads the data from memory blocks 104 and programs the read data to memory blocks 108 in QLC mode using MPP, for final reliable storage.

Although the programming schemes in FIGS. 3A-3C refer to programming in QLC mode, the schemes are applicable similarly to other programming modes such as, for example, TLC and PLC modes.

In some embodiments, the memory controller encodes the data using a first ECC, and programs the encoded data in memory blocks 104 in QLC mode using OPP. Upon copying the data to memory blocks 108, the memory reads the encoded data from memory blocks 104, decodes the first ECC of the encoded data, re-encode the data read from memory blocks 104 using a second ECC for producing re-encoded data, and programs the re-encoded data in memory blocks 108 in QLC mode using MPP. In some embodiments, since programming using OPP is less reliable than using MPP, the memory applies a first ECC that has higher decoding capabilities compared to the second ECC.

In some embodiments, the memory controller assigns storage space for storage in a SLC mode, and programs data to the assigned storage space in SLC mode. At a later time, the memory controller copies the data from the assigned storage space to another storage space using the MPP scheme or using the OPP scheme. The memory controller monitors a rate of receiving the data for programming, and programs the data using the MPP scheme or using the OPP scheme without first programming the data to the assigned storage space, in response to identifying that the rate of receiving the data is below a predefined threshold rate.

In some embodiments, the memory controller uses the OPP scheme or the MPP scheme (e.g., in QLC mode) instead of writing to SLC, even when SLC storage space is available, to reduce memory blocks wear out. In SLC mode the required number of memory cells is four times larger compared to the QLC mode (for the same amount of data). This results in a larger number of erase/program cycles and may reach the endurance limit of the memory. The memory system may balance the usage of QLC and SLC modes to optimize usage of the memory. The downside of this approach is reduced performance. Having a faster QLC mode (e.g., using the OPP scheme) alleviates some of this penalty and makes it less noticeable to the user.

Figure 4:
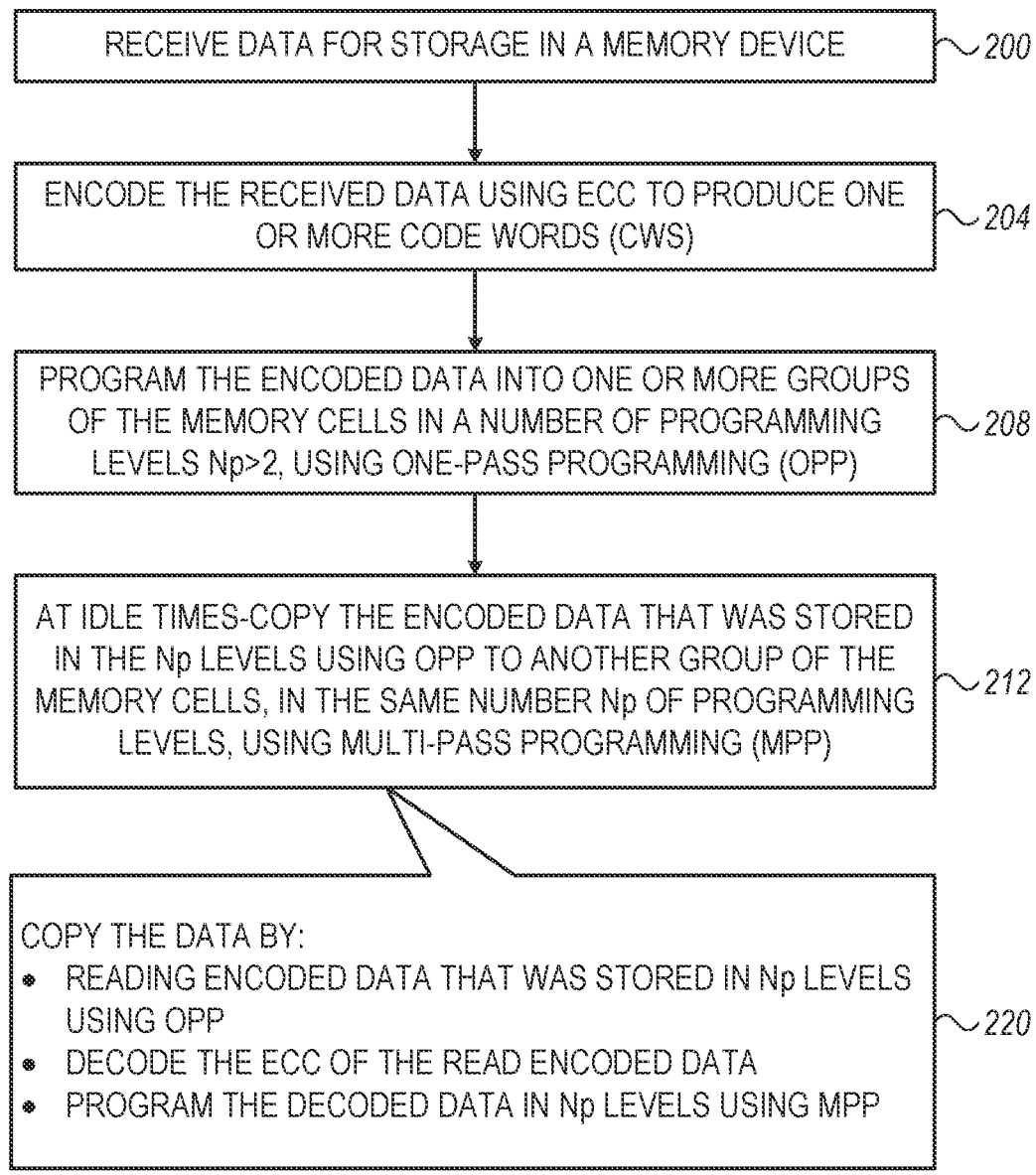
FIG. 4 is a flow chart that schematically illustrates a method for programming a nonvolatile memory device by applying a one-pass programming scheme followed by a multi-pass programming scheme, in accordance with an embodiment that is described herein.

FIG. 4 is a flow chart that schematically illustrates a method for programming a nonvolatile memory device by applying a one-pass programming scheme followed by a multi-pass programming scheme, in accordance with an embodiment that is described herein.

The method will be described as executed by memory controller 40, and in particular by processor 48 of the memory controller.

The method begins at a reception stage 200, with processor 48 receiving data for storage in memory device 24. The processor may receive the data, e.g., from host 52 or from any other suitable source. Alternatively, the memory controller may generate the data locally, or retrieve the data from the memory device. The data to be programmed may include user data such as a file in any suitable file format, e.g., a text file or a multimedia file such as a video file or an audio file. Alternatively, any other suitable type of user data can also be used.

At an encoding stage 204, the processor encodes the data of stage 200 using any suitable ECC, such as, for example, a suitable LDPC code. Encoding the data may be carried out by the processor itself, by host 52, by ECC module 50, or using any other suitable element. For large amounts of data, the processor encodes the data, in chunks, into multiple Code Words (CWs).

At a temporary storage stage 208, the processor programs the encoded data into one or more groups of the memory cells. The memory cells in a group may belong to a common WL. The processor programs the data in a predefined number of programming levels $N_p>2$ (e.g., in QLC $N_p=16$), using OPP.

At a final storage stage 212, the processor copies the encoded data that was stored in the Np levels using OPP, to another group of the memory cells, in the same number Np of programming levels, but using MPP. The copy operation is detailed at a copy stage 220 as follows. The processor (i) reads the encoded data that was stored in Np levels using OPP, (ii) decodes the ECC of the read encoded data, and (iii) programs the decoded data in Np levels using MPP. In some embodiments, before storing the decoded data using MPP, the processor re-encodes the decoded data using a suitable ECC, which may be the same or different from the ECC used in programming using OPP.

In the example method of FIG. 4, the same number of programming levels is used in both OPP and MPP. This, however, is not mandatory, and in alternative embodiments different numbers of programming levels (larger than two) may be used in OPP and in MPP, respectively.

Data Protection Schemes Used in OPP and MPP

As noted above, in some programming schemes the memory controller temporarily programs data in SLC mode, and later copies the data for final reliable storage in QLC using MPP. In such schemes, the memory controller can read the data that was programmed using MPP for verifying that the data has been programmed correctly. After successful verification, the processor may erase relevant memory blocks programmed in SLC mode. When program verification fails, the memory controller may recover the damaged data from the SLC storage space. Unlike SLC, in programming schemes that program data in in QLC (or in other mode having more than two programming levels) using OPP and then copy the data to another storage space in QLC using MPP, the original data may not be available for recovery, and therefore some kind of a data recovery scheme may be required.

In general, ECC is used for protecting from random errors, e.g., correcting relatively small number of errors due to, for example, programming errors, readout errors, high temperature retention, and the like. On the other hand, a data recovery scheme is used for recovering from extreme cases resulting in large numbers of errors, or some physical defect or malfunction that damages data stored in a relatively large storage space such as, for example, a WL, a memory block, a plane or even an entire die.

Figure 5:
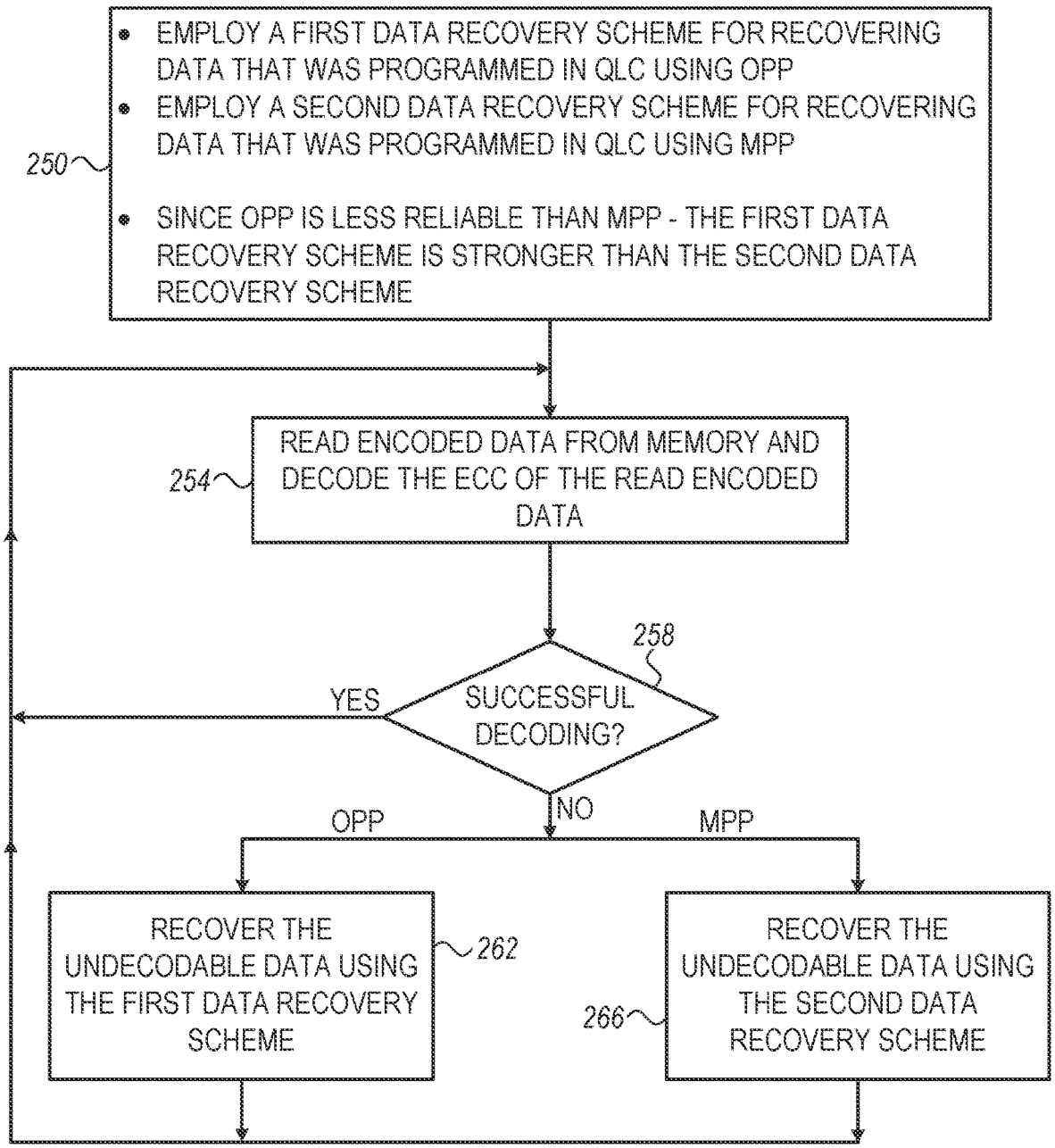
FIG. 5 is a flow chart that schematically illustrates usage of different data recovery schemes in one-pass and multi-pass programming, in accordance with an embodiment that is described herein.

FIG. 5 is a flow chart that schematically illustrates usage of different data recovery schemes in one-pass and multi-pass programming, in accordance with an embodiment that is described herein.

The data may be executed by memory controller, 40, R/W module 36, or both. The method will be described as executed by memory controller 40, and in particular by processor 48 of the memory controller.

At a data recovery scheme definition stage 250, the processor predefines first and second data recovery schemes for recovering data programmed in QLC mode using OPP and MPP, respectively. The processor may employ any suitable data recovery scheme, e.g., by storing, in addition to the data, redundancy data that may be used for recovering damaged data. For example, let D1 and D2 denote first data and second data to be protected, and let R denote redundancy data given by R=XOR(D1, D2). The XOR(·) operation denotes a bitwise logical XOR operation. Each of D1 and D2 may include, for example, one or more CWs of the underlying ECC used. In this embodiment, assuming that only one of D1, D2 is undecodable (and R is undamaged) at any given time, D1 may be recovered by calculating D1=XOR(D2,R) whereas D2 may be recovered by calculating D2=XOR(D1,R).

In some embodiments, since OPP is less reliable than MPP, the processor employs a first data recovery scheme for OPP that is stronger than the second data recovery scheme for MPP. The data recovery scheme is stronger than the second data recovery scheme, in a sense that it can recover a larger amount of data. For example, the first data recovery scheme may support the recovery of an entire memory block, whereas the second data recovery scheme may support the recovery of a single WL. In MPP, a recovery scheme for multiple WLs (e.g., 2 or 3 WLs may be used for recovering from WL-to-WL shorts that corrupt several WLs concurrently.

In some embodiments, MPP is followed by a read verify operation. In such embodiments, full block protection may not be required, and a data recovery scheme for MPP that reconstructs only a few WLs may be sufficient.

At a read and decode stage 254, the processor reads encoded data that was programmed in QLC mode (using OPP or MPP) and decodes the ECC of the read encoded data. For example, the processor decodes the ECC of one or more CWs retrieved from the memory device.

At a query stage 258, the processor checks whether all the data read at stage 254 is decodable using the ECC, and if so, loops back to stage 254 to read subsequent encoded data to read subsequent encoded data. Otherwise, at least part of the encoded data read is undecodable, and the processor proceeds to stage 262 or 266 depending on whether the encoded data was respectively programmed using OPP or MPP. In the present context, the term "undecodable" means that the CW contains a number of errors that exceeds the decoding capabilities of the underlying ECC decoding scheme being used.

At an OPP recovery stage 262 the processor recovers the undecodable data using the first data recovery scheme. At a MPP recovery stage 266 the processor recovers the undecodable data using the second data recovery scheme. Following each of stages 262 and 266, the processor loops back to stage 254 to read subsequent encoded data for verification.

Scheduling of Copying Data Programmed Temporarily Using OPP for Final Storage Using MPP Since data that is programmed in QLC mode using OPP is considered unreliable, this data should be copied elsewhere for final storage using MPP, at the first opportunity. This copy operation is also referred to herein as "OPP-MPP copy" operation. In some embodiments, one or more conditions should be fulfilled, to initiate the OPP-MPP copy operation, as described herein.

In some embodiments, processor 48 performs OPP-MPP copy operations at idle times, e.g., when the user does not access the memory for writing and/or reading data. In an embodiment, processor 48 copies the data programmed using OPP for final storage using MPP, with higher priority than other background tasks such as garbage collection or refreshing of memory blocks. In another embodiment, OPP-MPP copy operations may be combined with garbage collection operations. In such embodiments, the memory controller defers the OPP-MPP copy operation of a given memory block until this block needs to be copied for garbage collection. By combining copy operations of OPP-MPP and garbage collection, the overall number of copy operations advantageously reduces.

In some embodiments, the processor performs OPP-MPP copy operations when identifying that it has sufficient resources for performing this OPP-MPP copy operation. For example, the processor delays the OPP-MPP copy operation until detecting that the memory controller, memory device or both are connected to an external power source.

In some embodiments, scheduling the OPP-MPP copy operation is conditioned by one or more environmental factors such as temperature. It is well known that data read from the memory device may be corrupted when being read at a temperature different from the temperature at programming this data. In some embodiments, processor 48 delays the OPP-MPP copy operation until detecting that the present temperature is not extreme, or until the temperature is close to the temperature at time of the programming the data using OPP.

The embodiments described herein are given by way of example, and other suitable embodiments can also be used. For example, although the embodiments described above refer mainly to programming in QLC mode, the disclosed embodiments are similarly applicable to other programming modes such as TLC and PLC.

Although the embodiments described above refer mainly to a memory device that includes NAND memory cells, the disclosed embodiments are similarly applicable to other suitable types of memory cells.

The embodiments described above refer mainly to a memory device in which a relatively small storage space is allocated to programming in SLC mode. In alternative embodiments, an Opportunistic SLC (oSLC) mode may be used. In using oSLC, when receiving a large amount of data to be programmed and memory bocks for programming in TLC/QLC mode are available, the data may be programmed in SLC mode to the TLC/QLC area, and later copied, e.g., at idle times, in TLC/QLC mode using MPP. In using oSLC, the storage drive may fill up quickly because TLC/QLC blocks are programmed in SLC mode. Consequently, the storage drive may slow down when moving the data programmed in SLC for storage in TLC/QLC mode.

The disclosed embodiments are applicable, for example, in harsh environments (such as under cosmic or other types of radiation). one way to circumvent the effects of harsh environmental conditions is to copy data that was programmed under harsh conditions to another location when the environmental conditions become less stressful. For example, in an embodiment, data is programmed in SLC mode during periods of harsh environmental conditions and is later transferred elsewhere in QLC mode (e.g., using OPP followed by MPP). This may be applicable to automotive applications in which the memory device may be exposed to extreme temperatures, vibration and electrical interference. Similarly, in a storage system that does not support the OPP scheme, data programed in harsh environmental conditions may be marked to be later refreshed, e.g., copied to a different location in memory when the environmental conditions are suitable.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage apparatus, comprising:
    an interface, configured to communicate with a plurality of memory cells, wherein an individual one of the plurality of memory cells is configured to store data in multiple programming levels; and
    storage circuitry configured to:
        program data to a first group of multiple memory cells in a number of programming levels larger than two, using a One-Pass Programming (OPP) scheme that results in a first readout reliability level;
        after programming the data, read the data from the first group, and program the data read from the first group to a second group of the memory cells, in a number of programming levels larger than two, using a Multi-Pass Programming (MPP) scheme that results in a second readout reliability higher than the first reliability level; and
        read the data from the second group of the memory cells.

2. The storage apparatus according to claim 1, wherein a number of programming levels in using the OPP scheme equals a number of programming levels in using the MPP scheme.

3. The storage apparatus according to claim 1, wherein a number of programming levels in using the OPP scheme differs from a number of programming levels in using the MPP scheme.

4. The storage apparatus according to claim 1, wherein the data stored in the first group using the OPP scheme is encoded using a first Error Correction Code (ECC), and wherein the storage circuitry is configured to decode the first ECC of the encoded data read from the first group to produce decoded data, to re-encode the decoded data using a second ECC for producing re-encoded data, and to program the re-encoded data in the second group using the MPP scheme.

5. The storage apparatus according to claim 4, wherein the first ECC has higher decoding capabilities compared to the second ECC.

6. The storage apparatus according to claim 1, wherein the storage circuitry is configured, in response to detecting that programming the data in the first group has failed, to apply a first data recovery scheme, and in response to detecting that programming the data in the second group has failed, to apply a second data recovery scheme.

7. The storage apparatus according to claim 6, wherein the first data recovery scheme supports recovering an amount of data larger than the second data recovery scheme.

8. The storage apparatus according to claim 1, wherein the storage circuitry is configured to program the data to the second group using the MPP scheme in selected periods during which the storage circuitry has available resources for programming the data to the second group using the MPP scheme.

9. The storage apparatus according to claim 1, wherein the storage circuitry is configured to initially program second data in a Single-Level Cell (SLC) mode, outside the first group and the second group.

10. The storage apparatus according to claim 9, wherein the storage circuitry is configured to read at least part of the second data that was programmed in SLC mode, and to program the at least part of the second data in the first group using the OPP scheme, for freeing up SLC storage space.

11. The storage apparatus according to claim 1, wherein the storage circuitry is configured to assign storage space for storage in a Single-Level Cell (SLC) mode, but to store the data in the first group using the OPP scheme, in response to identifying that no free space is available in the storage space assigned for programming in the SLC mode.

12. The storage apparatus according to claim 1, wherein the storage circuitry is configured to assign storage space for storage in a Single-Level Cell (SLC) mode, to program third data to the assigned storage space in SLC mode and at a later time copy the data from the assigned storage space to another storage space using the MPP scheme or using the OPP scheme, to monitor a rate of receiving the third data for programming, and to program the third data using the MPP scheme or using the OPP scheme without first programming the third data to the assigned storage space, in response to identifying that a rate of receiving the third data is below a predefined threshold rate.

13. A method for data storage, comprising:
    in a storage apparatus that communicates with a plurality of memory cells, wherein an individual one of the plurality of memory cells stores data in multiple programming levels,
    programming data to a first group of multiple memory cells, in a number of programming levels larger than two, using a One-Pass Programming (OPP) scheme that results in a first readout reliability level;
    after programming the data, reading the data from the first group, and programming the data read from the first group to a second group of the memory cells, in a number of programming levels larger than two, using a Multi-Pass Programming (MPP) scheme that results in a second readout reliability higher than the first reliability level; and
    reading the data from the second group of the memory cells.

14. The method according to claim 13, wherein a number of programming levels in using the OPP scheme equals a number of programming levels in using the MPP scheme.

15. The method according to claim 13, wherein a number of programming levels in using the OPP scheme differs from a number of programming levels in using the MPP scheme.

16. The method according to claim 13, wherein the data stored in the first group using the OPP scheme is encoded using a first Error Correction Code (ECC), and comprising decoding the first ECC of the encoded data read from the first group to produce decoded data, re-encoding the decoded data using a second ECC for producing re-encoded data, and programming the re-encoded data in the second group using the MPP scheme.

17. The method according to claim 16, wherein the first ECC has higher decoding capabilities compared to the second ECC.

18. The method according to claim 13, and comprising, in response to detecting that programming the data in the first group has failed, applying a first data recovery scheme, and in response to detecting that programming the data in the second group has failed, applying a second data recovery scheme.

19. The method according to claim 18, wherein the first data recovery scheme supports recovering an amount of data larger than the second data recovery scheme.

20. The method according to claim 13, wherein programming the data to the second group comprises programming the data to the second group using the MPP scheme in selected periods during which the storage circuitry has available resources for programming the data to the second group using the MPP scheme.

21. The method according to claim 13, and comprising initially programming second data in a Single-Level Cell (SLC) mode, outside the first group and the second group.

22. The method according to claim 21, and comprising reading at least part of the second data that was programmed in SLC mode, and programming the at least part of the second data in the first group using the OPP scheme, for freeing up SLC storage space.

23. The method according to claim 13, and comprising assigning storage space for storage in a Single-Level Cell (SLC) mode, but storing the data in the first group using the OPP scheme, in response to identifying that no free space is available in the storage space assigned for programming in the SLC mode.

24. The method according to claim 13, and comprising assigning storage space for storage in a Single-Level Cell (SLC) mode, programming third data to the assigned storage space in SLC mode and at a later time copying the data from the assigned storage space to another storage space using the MPP scheme or using the OPP scheme, monitoring a rate of receiving the third data for programming, and programming the third data using the MPP scheme or using the OPP scheme without first programming the third data to the assigned storage space, in response to identifying that a rate of receiving the third data is below a predefined threshold rate.

* * * * *